(12) United States Patent
Chang et al.

(10) Patent No.: US 9,929,334 B2
(45) Date of Patent: Mar. 27, 2018

(54) JOSEPHSON JUNCTION WITH SPACER

(71) Applicant: International Business Machines Corporation, Armonk, NY (US)

(72) Inventors: Josephine B. Chang, Mahopac, NY (US); Michael A. Guillorn, Yorktown Heights, NY (US); Ryan M. Martin, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 14/597,310

(22) Filed: Jan. 15, 2015

(65) Prior Publication Data

US 2016/0211438 A1    Jul. 21, 2016

(51) Int. Cl.
*H01L 39/22* (2006.01)
*H01L 39/24* (2006.01)

(52) U.S. Cl.
CPC ........ *H01L 39/223* (2013.01); *H01L 39/2493* (2013.01)

(58) Field of Classification Search
CPC .......................... H01L 39/223; H01L 39/2493
See application file for complete search history.

(56) References Cited

U.S. PATENT DOCUMENTS

| | | | | |
|---|---|---|---|---|
| 4,432,134 A * | 2/1984 | Jones | ................. | H01L 39/2493 216/3 |
| 5,034,374 A * | 7/1991 | Awaji | .................. | H01L 39/2496 257/35 |
| 5,215,960 A * | 6/1993 | Tanaka | ................ | H01L 39/2496 204/192.24 |
| 5,422,497 A * | 6/1995 | Saitoh | ................... | H01L 39/225 257/30 |
| 8,437,818 B1 | 5/2013 | Tolpygo et al. | | |
| 8,508,280 B2 | 8/2013 | Naaman et al. | | |
| 8,654,578 B2 | 2/2014 | Lewis et al. | | |
| 2005/0107261 A1* | 5/2005 | Cantor | .............. | G01R 33/0052 505/100 |
| 2006/0123363 A1 | 6/2006 | Williams et al. | | |

(Continued)

OTHER PUBLICATIONS

Chang et al., "Suspended Superconducting Qubits," U.S. Appl. No. 13/834,291, filed Mar. 15, 2013.

(Continued)

*Primary Examiner* — Bilkis Jahan
*Assistant Examiner* — Victor Barzykin
(74) *Attorney, Agent, or Firm* — Michael D. Purdham

(57) ABSTRACT

Various embodiments are directed toward a circuit configured to act as a Josephson junction. The circuit includes: a junction stack on a substrate, the junction stack including a portion of a first superconductor electrode, with an interface layer on a top side of the first superconductor electrode and configured to act as a tunneling barrier for the junction stack. The circuit may also comprise a first portion of a second superconductor electrode on top of the interface layer. A spacer may separate the portion of the first superconductor electrode in the junction stack from a second portion of the second superconductor electrode outside the junction stack where the second superconductor electrode overlays the first superconductor electrode.

8 Claims, 5 Drawing Sheets

(56) References Cited

U.S. PATENT DOCUMENTS

2010/0075503 A1* 3/2010 Bencher ............ H01L 21/3086
438/703
2011/0089405 A1  4/2011 Ladizinsky et al.
2013/0119351 A1  5/2013 Shea et al.
2013/0196855 A1  8/2013 Poletto et al.
2014/0026108 A1  1/2014 Bocharov et al.

OTHER PUBLICATIONS

Gunnarsson et al., "Dielectric losses in multi-layer Josephson junction qubits," Superconductor Science and Technology, Aug. 2013, vol. 26, No. 8 DOI:10.1088/0953-2048/26/8/085010.
Nakamura et al., "Superconducting qubits consisting of epitaxially grown NbN/AlN/NbN Josephson junctions," Applied Physics Letters, Nov. 2011, vol. 99, Issue 21 DOI: 10.1063/1.3663539.
Weides et al., "Phase qubits fabricated with trilayer junctions," Superconductor Science and Technology 24, 2011, © 2011 IOP Publishing Ltd DOI: 10.1088/0953-2048/24/5/055005.
Weides et al., "Coherence in a transmon qubit with epitaxial tunnel junctions," Applied Physics Letters 99, 2011, Copyright 2011 American Institute of Physics DOI: 10.1063/1.3672000.
Chang et al., "Josephson Junction With Spacer", U.S. Appl. No. 15/786,651, filed Oct. 18, 2017.

* cited by examiner

JOSEPHSON JUNCTION WITH SPACER

BACKGROUND

Aspects of the present disclosure relate to quantum computing devices, and more particular aspects relate to Josephson junctions that can be used to store and handle quantum bits (qubits).

In the pursuit of practical quantum computing devices, manufacturers are pursuing various methods of handling qubits, or quantum bits, which may allow for greatly increasing the performance of computing devices. Quantum bits allow computing device to use a combination of superimposed quantum states to store and manipulate information and perform calculations. Josephson junctions are one type of structure or hardware device capable of storing quantum bits for use in quantum computers.

SUMMARY

Various embodiments are directed toward a circuit configured to act as a Josephson junction, comprising: a junction stack on a substrate, the junction stack including a portion of a first superconductor electrode, an interface layer on a top side of the first superconductor electrode and configured to act as a tunneling barrier for the junction stack, and a first portion of a second superconductor electrode on top of the interface layer. A spacer may separate the portion of the first superconductor electrode in the junction stack from a second portion of the second superconductor electrode outside the junction stack.

Aspects of the present disclosure are directed toward a method of making a circuit configured to act as a Josephson junction, the method beginning with: creating a tri-layer stack on a substrate by depositing a first layer of superconductor material; forming an interface layer on the first layer; and depositing a second layer of superconductor material on the interface layer; followed by shaping a first superconductor electrode from the tri-layer stack by etching the tri-layer stack outside a first pattern to expose the substrate; depositing a spacer on a perimeter of the first superconductor electrode; and depositing a third layer of superconductor material on the substrate, the spacer, and the first superconductor electrode. The method may end with shaping a second superconductor electrode by: creating a second pattern on the third layer of superconductor material that at least partially overlays a first portion of the first superconductor electrode; and etching the third layer to expose the substrate and the interface layer such that a second portion of the superconductor electrode overlays the first portion of the first superconductor electrode.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
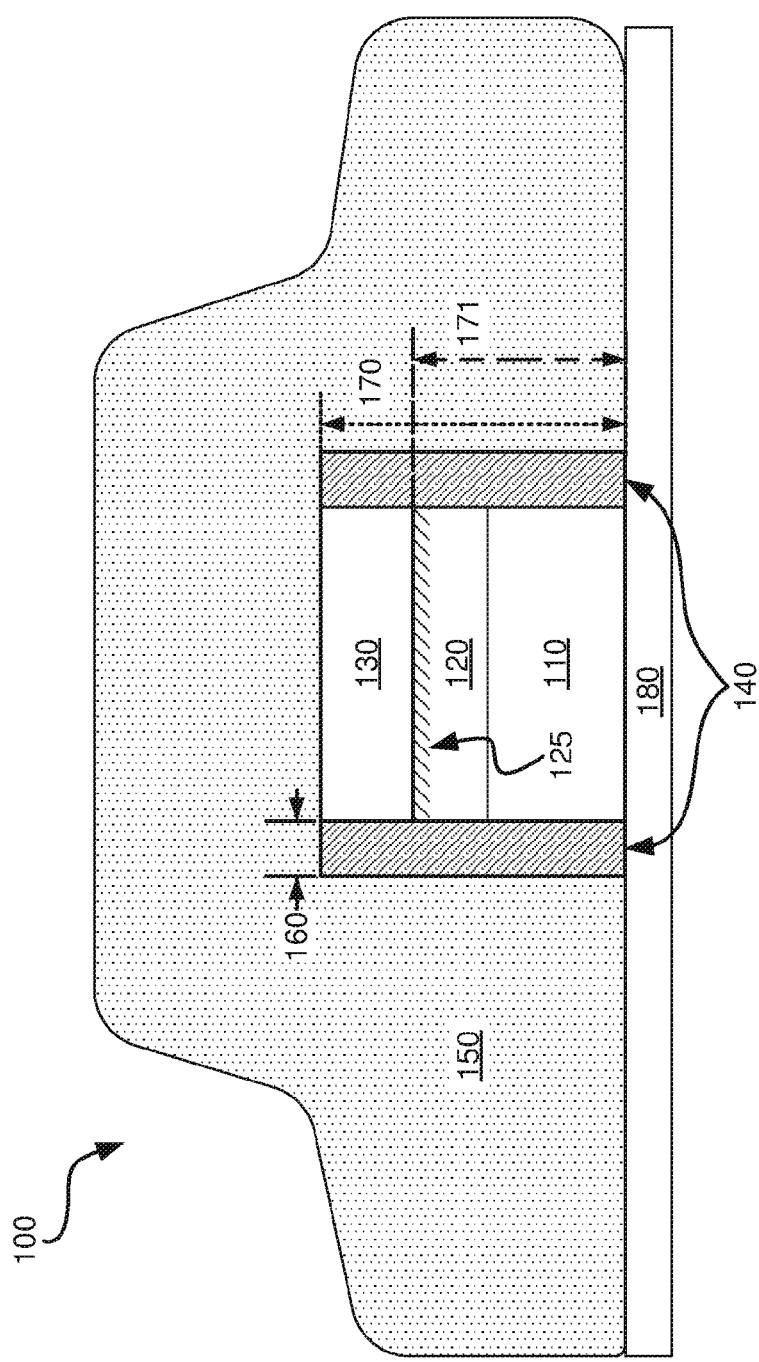
FIG. 1 depicts a cross section of a Josephson junction according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to quantum computing devices, and more particular aspects relate to Josephson junctions that can be used to store and handle quantum bits (qubits). While the present disclosure is not necessarily limited to such applications, various aspects of the disclosure may be appreciated through a discussion of various examples using this context.

Decoherence is the breakdown of resonant current inside a superconducting loop caused by energy loss. Decoherence may be induced by elements intrinsic to the Josephson junction, such as such as a thin layer of insulator or non-superconducting metal, or a physical constriction of the superconducting material. Extrinsic elements may also induce energy loss from a resonant current in a superconductor loop, causing decoherence. Extrinsic elements may include dielectric material that surrounds and encapsulates a superconductor in a Josephson junction, or may also include thermal effects that cause the superconductivity of the circuit to break down, leading to energy loss caused by electrical resistance. During operation, the superconductor portions of a Josephson junction carry signals from one part of the system to another without energy loss, while the part of the junction that rests between the major superconductor portions, whether an insulator, a non-superconducting metal, or physical constriction, serves to induce decoherence in the circuit. The controlled character of an intrinsic circuit element can lead to controlled decoherence of a Josephson junction's signal, while the less controllable character of extrinsic elements may lead to greater difficulty creating reproducible and predictable decoherence of signals in the junction circuit. The duration of resonance in a Josephson junction, associated with more-controlled decoherence (and overall reductions in energy loss from the junction circuit) can be relevant to the performance of electrical circuits, especially those that are intended to handle qubits.

The nature of a Josephson junction's structure can influence the ultimate performance of circuits that contain them. Embodiments of the present disclosure relate to Josephson junctions that can be manufactured using techniques used to create integrated circuits on semiconductor substrates. One method of making a Josephson junction may involve the use of a nonconductive spacer material between the superconductor electrodes in the Josephson junction. The nonconductive spacer can block electrical current from flowing between the first and second superconductor electrodes in the Josephson junction circuit where they overlay each other. The benefits of integrated circuit manufacturing techniques can facilitate creation of a Josephson junction with precise dimensional control in both horizontal or lateral and vertical directions. Embodiments of the present disclosure may include a spacer, rather than bulk dielectric material, that conforms to the perimeter of a first superconductor electrode. Josephson junction designs with spacers, rather than bulk dielectric material, can induce decoherence at a lower rate than is expected for devices with bulk dielectric material surrounding one or both superconductor electrodes.

Horizontal dimension control may be accomplished using photolithographic techniques for patterning blanket layers of material deposited on a substrate followed by chemical etching such as with a plasma. Horizontal dimension control may also be accomplished using epitaxial growth of films, where precise control of film thicknesses can tailor the thickness of, e.g., spacer films between the first and second superconductor electrodes. Vertical dimension control, such as for thicknesses of superconductor electrodes or layers of non-superconducting metal or insulating material between superconductor electrodes, may also be accomplished using film deposition techniques available to integrated circuit manufacturers.

FIG. 1 depicts a cross section 100 of an electrical circuit configured to operate as a Josephson junction, highlighting the presence of a thin spacer 140 between a first superconductor electrode and a second superconductor electrode. A Josephson junction with a thin spacer 140 may include a first layer 110 of superconductor metal on which an interface layer made of interface material 120 has been grown or deposited. In some embodiments of the present disclosure, the interface material 120 may be a non-superconductor metal such as silver (Ag). Other interface materials may include cobalt (Co), nickel (Ni), nickel-iron (NiFe), and cadmium (Cd). The electrical behavior of a material, and especially whether it exhibits the property of superconductivity, can vary with the temperature of the material. Superconductivity can appear in a material as the temperature decreases below a critical temperature for that material. In other words, when a material is cooled below the critical temperature, the electrical resistance drops to (effectively) zero.

In further embodiments, the top layer of the interface material 120 may be oxidized to form an insulating layer 125. In embodiments containing aluminum as the interface material 120, the insulating layer 125 may be an aluminum oxide such as $Al_2O_3$. Other embodiments may use lead (Pb) as the interface material and a lead oxide compound (e.g., PbO) as the insulating layer 125. A variety of superconducting metals may be used for the electrodes (interface material) and an oxide of the superconducting metal can be used to form the interface material (or dielectric barrier) in the Josephson junction. A second layer 130 of superconductor metal may rest on top of the insulating layer 125.

A spacer 140 may conform to the sides of the first superconductor electrode and surround the first layer 110 of superconductor material, the interface layer 120, any oxidized part of the interface layer 125, and the second layer 130 of superconductor metal. The spacer 140 can, according to embodiments, have different heights, so long as the height 170 of the top edge of the spacer is taller than the insulating layer height 171 above the substrate 180 on which the Josephson junction is being formed. In certain embodiments and as discussed herein, the spacer can be formed by a deposition process.

A third layer 150 of superconductor metal may overlay the stack, but not the rest of the first superconductor electrode, as described above. The third layer 150 of superconductor material is in direct contact with the second layer 130 (in the junction stack), but is electrically isolated from the first layer 110, the interface material 120, and the insulating layer 125 by the spacer 140 around the perimeter of the first superconductor electrode. Accordingly, the second and third layers can function as a single superconductor for the purposes of the Josephson junction, with the first layer 110 functioning as the other superconductor of the Josephson junction.

Because the spacer 140 completely surrounds the lower portion of the Josephson junction and the first superconductor electrode, the contact between the second layer 130 and the third layer 150 is limited to the width of the third layer 150 as determined by the pattern used to create the second superconductor electrode shape. Dividing parts of the stack and the third layer according to their electrical function, the first layer 110 of superconductor material is part of the first superconductor electrode. The interface layer 120 and the insulating layer 125 (if present) are part of the junction interface. The conductive material of the interface layer 120 may, in some embodiments, be considered part of the first superconductor electrode, or may be considered as part of the decoherence-inducing layer between superconductor electrodes. The second superconductor electrode may include both the third layer 150 of superconductor metal and the second layer 130 of superconductor metal, according to embodiments. The second superconductor layer may wrap around the top portion of the spacer 140 and extend down the outside of the spacer 140 to rest on the substrate 180. The first superconductor electrode, the spacer, and the second superconductor electrode all rest on the substrate 180. Further, the spacer electrically isolates the first and second superconductor electrodes from each other along a line parallel to the major horizontal surface of the substrate 180.

Spacer materials may include, but not be limited to, traditional spacer materials such as silicon nitride. Some spacers 140 may be deposited conformally on exposed surfaces of the integrated wafer surface where the Josephson junction is being made. In such cases, the width 160 of the spacer is the same on all sides of the superconductor electrode (sides as well as the top of the electrode. Examples of spacer materials may include silicon dioxide ($SiO_2$), silicon nitride (SiN), SiBCN, and SiCOH. A superconductor material used to make the first superconductor electrode or the second superconductor electrode is only superconducting at temperatures below the critical temperature of the material. In general, critical temperatures for metallic superconductor materials are well below room temperature, being between about 1 to 250 degrees Kelvin).

Superconductors may be superconducting only at cryogenic temperatures. Superconductor materials may include, but not be limited to, pure metals such as: niobium (Nb), aluminum (Al), lead (Pb), indium (In), lanthanum (La), rhenium (Rh), tin (Sn), tantalum (Ta), vanadium (Va), metal alloys or compounds such as $LaB_6$, $MgB_2$, $Nb_3Al$, $Nb_3Ge$, NbO, NbN, $Nb_3Sn$, NbTi, $YB_6$, TiN, ZrN, $ZrB_{12}$, $Ba_8Si_{46}$, $C_6Ca$, $C_6Li_3Ca_2$, $C_8K$, $C_8KHg$, $C_6K$, $C_3K$, $C_3Li$, $C_2Li$, $C_3Na$, $C_2Na$, $C_6Sr$, $C_6Yb$, $C_{60}Cs_2Rb$, $Ba_8Si_{46}$, $C_6Ca$, $C_6Li_3Ca_2$, $C_2Na$, $C_6Yb$, $C_{60}Cs_2Rb$, $C_{60}K$, or oxides of metal/metalloid alloys such as yttrium barium copper oxide (YBCO). The various layers of superconductor material may all be the same, or they may all be different from each other, according to the manufacturing strategy of the circuit containing the Josephson junction circuit.

Figure 2:
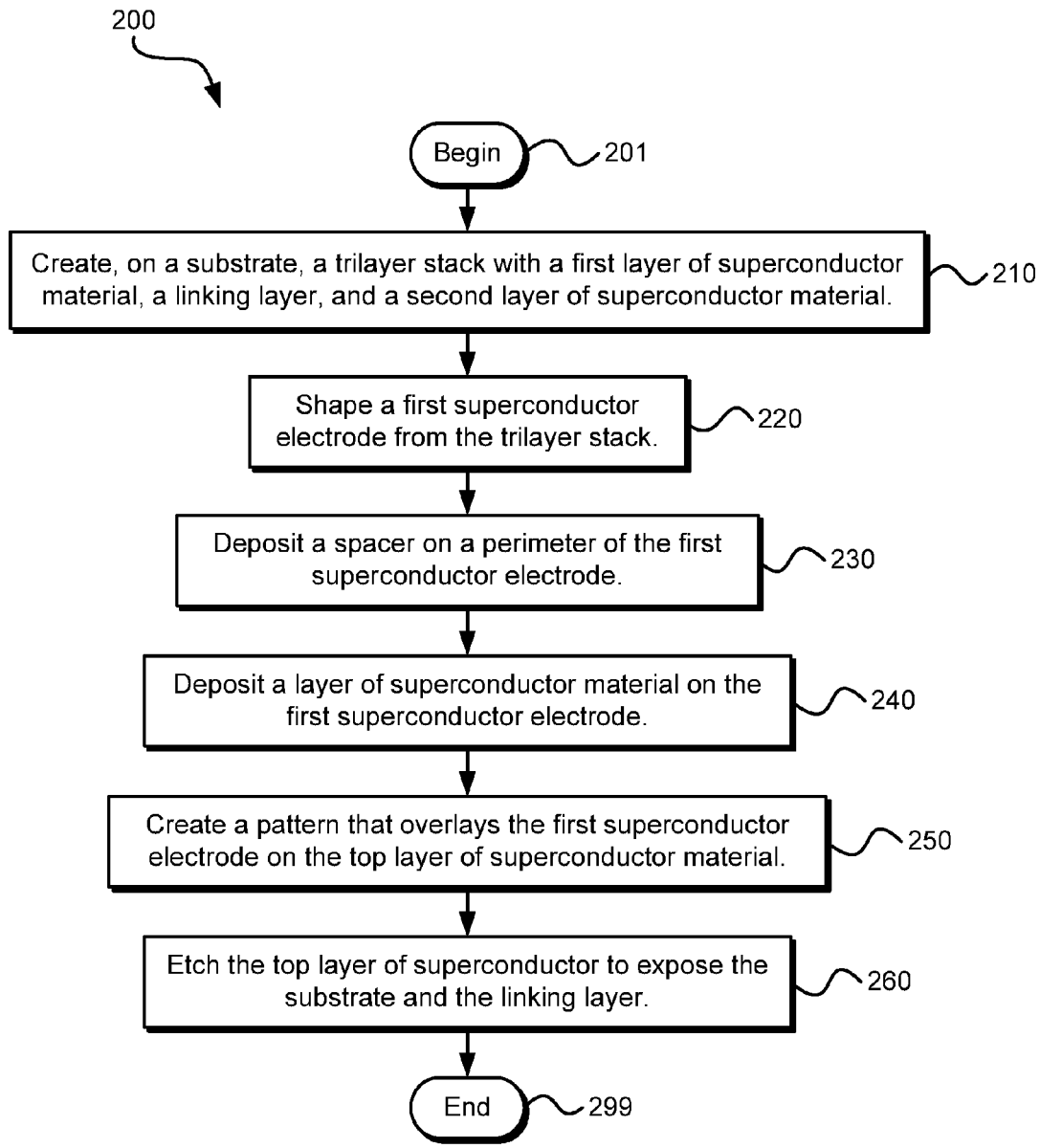
FIG. 2 describes a method of manufacturing Josephson junctions having a spacer, according to embodiments of the present disclosure.

FIG. 2 describes a method 200 of manufacturing Josephson junctions having a spacer, according to embodiments of the present disclosure, including instructions to form a spacer around the perimeter of the first superconductor electrode. The method begins in block 201.

In the first step in the method a manufacturer can create a tri-layer stack on a substrate, as described in block 210. The tri-layer stack includes a first layer of superconductor material, an interface layer on top of the first layer of superconductor material, and a second layer of superconductor material on top of the interface layer. In some embodiments, the interface layer may be made of a non-superconductor metal, as described in FIG. 1. In some embodiments, the interface layer may include a thin layer of oxidized material created by exposing the interface layer material to oxygen in a controlled manner, in order to generate a controlled thickness of oxide.

The method may continue with a step to shape a first superconductor electrode from the tri-layer stack, as described in block 220. The shaping of the first superconductor electrode may be accomplished by depositing a mask material such as photoresist on top of the tri-layer stack and then patterning it. The patterning may be accomplished by traditional photolithography techniques, or may be triggered by other methods. Once the patterning is complete, the tri-layer stack is etched away outside of the patterned areas in order to remove all three layers of the tri-layer stack and expose the substrate on which the tri-layer stack was deposited.

After the first superconductor electrode is shaped, the spacer is deposited on the perimeter of the first superconductor electrode, as described in block 230. Spacer definition involves depositing a layer of spacer material on the surface of a wafer, including both horizontal and vertical exposed surfaces, and then performing an anisotropic etch to remove the spacer material on the horizontal surfaces while leaving spacer material on vertical services, such as the side of the first superconductor electrode. Clearing the horizontal surfaces of spacer material may result in a spacer on the side of the first superconductor electrode with a spacer height equal to the height of the first superconductor electrode in some embodiments. In other embodiments, in order to completely clear the horizontal surfaces of spacer material, a manufacturer may select to perform an over etch process, and thus reducing the height of the spacer on the side of the first superconductor electrode below the height of the tri-layer stack in the electrode footprint area.

After spacer deposition, a manufacturer may proceed by depositing a third layer of superconductor material on top of the spacer and the first superconductor electrode, as described in block 240. This deposition step is a blanket deposition, covering everything on the wafer surface with superconductor material.

A manufacturer may then create a pattern on top of the third layer of superconductor material such that the second pattern at least partly overlays the tri-layer stack in the first superconductor electrode footprint, as described in block 250. The second pattern defines the shape of the second superconductor electrode that will be created in a subsequent etch step. The portion of the first superconductor electrode that is overlaid by the second pattern is where the Josephson junction interface will be created. The rest of the tri-layer stack in the first superconductor electrode footprint can then be etched back to leave only the first layer of superconductor material and the interface layer.

Finally, the third layer of superconductor material is etched away outside of the second pattern, as described in block 260. This etch step not only exposes the substrate in areas outside of the second pattern and outside of the spacer that surrounds the first superconductor electrode footprint, but also etches away the second layer of superconductor electrode within the first superconductor electrode footprint (or within the spacer perimeter of the first superconductor electrode) to expose the interface layer that was originally between the first and second layers of superconductor material. In some embodiments, where the interface layer includes only a non-superconductor metal, the non-superconductor metal is exposed during the final etch step. In other embodiments, where the interface layer includes an oxidized layer on top of the interface layer (and oxidized surface), the oxidized layer is exposed.

In some embodiments, the first superconductor electrode and the second superconductor electrode have two major portions: a pad area and an extension. The pad area can be a fairly large area configured to join with a contact created in the integrated circuit, while an extension can be a fairly long, narrow part of the superconductor electrode that extends outward from the pad area. In some embodiments, the extension may be a straight segment, while in others, the extension may have one or more bends or turns in order to allow extensions of superconductor electrodes to cross each other to create Josephson junctions at the position of the crossing. The method ends in block 299.

Figure 3:
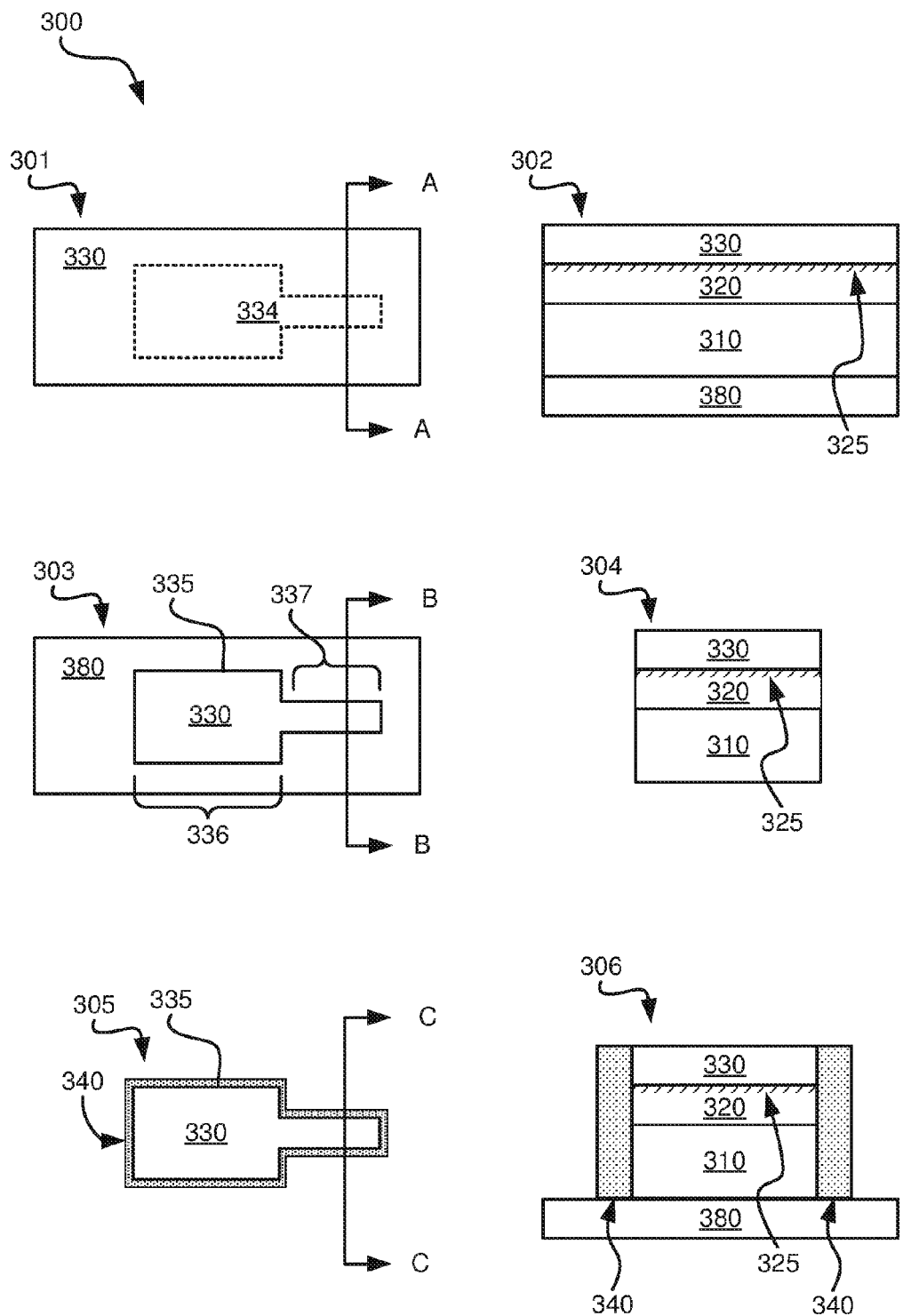
FIG. 3 depicts several views of a representative Josephson junction electrode through a manufacturing process, according to embodiments.

FIG. 3 depicts several views 300 of a representative Josephson junction electrode through a manufacturing process, according to embodiments. The several views 300 outline the various stages of manufacturing a circuit that contains the elements of a Josephson junction. The first view 301 is a top down view of a tri-layer stack as described previously in FIG. 2. A second layer of superconductor material 330 is visible in the first view 301. A first pattern 334 has been created on top of the second layer of superconductor material 330. The position of a cross-section "A-A" is marked in the first view 301. A second view 302 indicates the layers of the tri-layer stack at the position of the cross section A-A. A first layer of superconductor material 310 is on the bottom of the stack and rests upon a substrate 380. An interface layer 320 rests on top of the first layer of superconductor material 310. An upper portion of the interface layer 320 may be an oxidized layer 325. Oxidized layers can be created by exposing the surface of an interface layer 322 to a controlled amount of oxygen to grow a native oxide on the surface of the interface layer, and some oxygen may penetrate partially into the interface layer 320. The amount of oxygen can regulate the final thickness of the oxidized layer 325. A second layer of superconductor material 330 rests on top of the interface layer 320.

A third view 303 shows a remaining portion of the tri-layer stack 335 following etching the tri-layer stack to expose the substrate 380 on which the tri-layer stack was deposited. The shape of the remaining portion of the tri-layer stack conforms to the shape of the first pattern 334. The portion of the tri-layer stack includes a pad area 336 and an extension 337. A cross section "B-B" position is marked relative to the remaining portion of the tri-layer stack in the third view 303.

A fourth view 304 is a cross-sectional view of the remaining portion of the tri-layer stack at the location of cross section B-B. The first layer of superconductor material 310, the interface layer 320, the oxidized layer 325, and the second layer of superconductor material 330 are substantially similar to the layers in the second view 302.

A fifth view 305 portrays the remaining portion of the tri-layer stack of 335 after depositing a blanket layer of spacer material on top of the remaining portion of the tri-layer stack 335 and then performing an anisotropic etch in order to remove the spacer material from horizontal surfaces on and surrounding the remaining portion of the tri-layer stack 335. Following the anisotropic etch to remove spacer material from horizontal surfaces, a vertical spacer 340 remains on a sidewall or perimeter of the remaining portion of the tri-layer stack 335. The location of a cross-sectional view "C-C" is marked on the extension of the remaining portion 335. A sixth view 306 shows the position of materials in the remaining portion of the tri-layer stack 335 and the spacer 340, according to embodiments, after the spacer is formed. The first layer of superconductor 310 rests on the substrate 380, the interface layer 320 lies on the first layer of superconductor material 310, and an oxidized layer 325 in the interface layer 320 is at the top of the interface layer 320. The second layer of superconductor material 330 is on top of the interface layer 320 and is visible in a top view of the remaining portion of the tri-layer 335. A spacer 340 is on the side of the remaining portion 335 and conforms to the side of the remaining portion 335.

Figure 4:
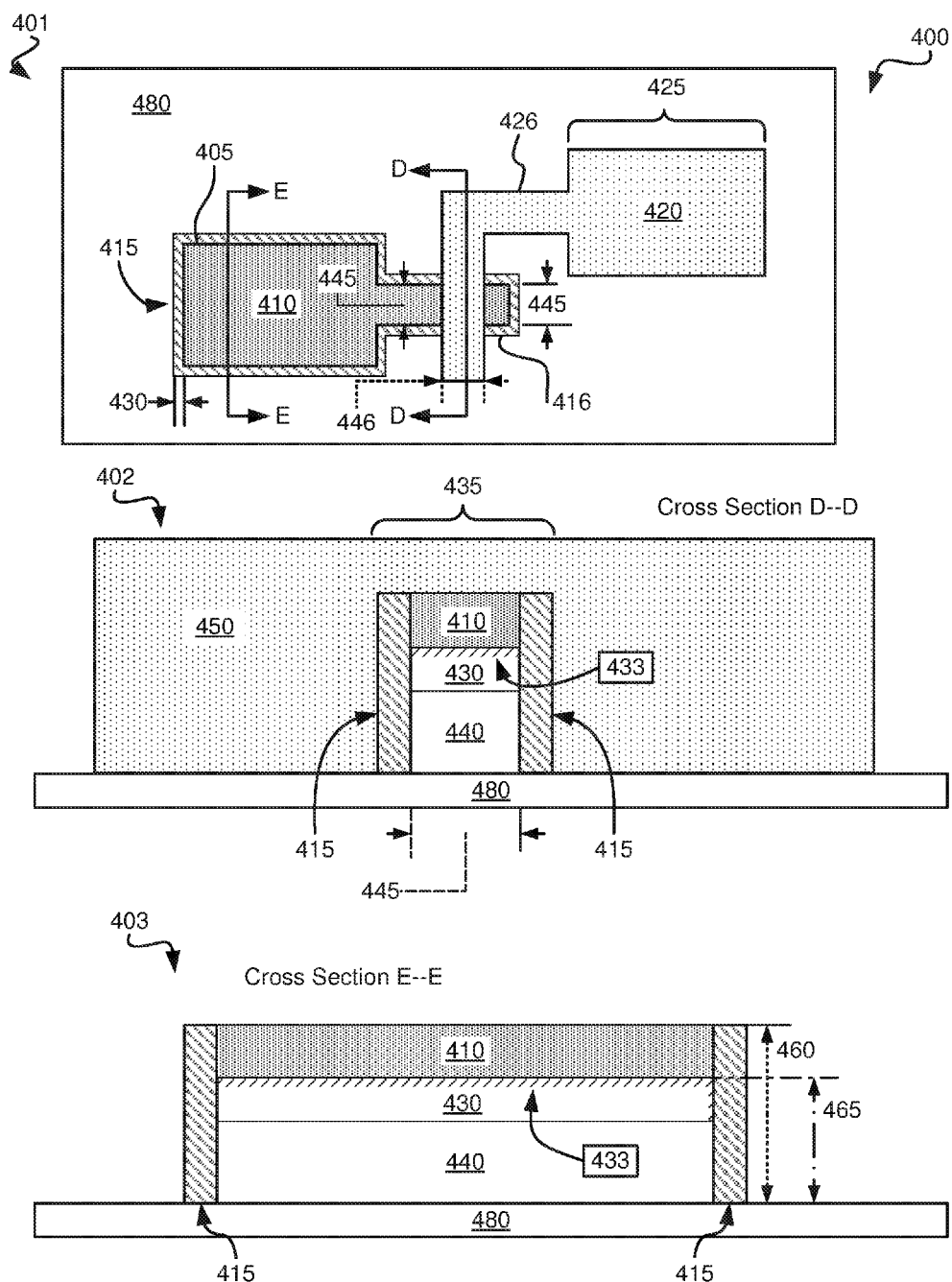
FIG. 4 depicts several views of a Josephson junction after a second electrode is created, according to embodiments.

FIG. 4 depicts several views 400 of a Josephson junction after a second electrode is created, according to embodiments. The several views 400 describe an intermediate state of the manufacture of a circuit containing a Josephson junction, after the second superconductor electrode 420 has been defined and the substrate 480 exposed, but before the interface layer 430 in the first superconductor electrode 405 is exposed in the final circuit structure.

In a first view 401, the relative position of the first superconductor electrode 405 is depicted where a second layer of superconductor material 410 is visible. The first superconductor electrode 405 has a first pad area and a first extension 416, and the second superconductor electrode 420 with a second pad area 425 and a second extension 426 that crosses the first extension 416. The first superconductor electrode 405 is surrounded by a spacer 415 with a spacer thickness 430, and the first extension 416 has a first extension width 445 where it passes beneath the second extension 426. The first extension width 445 does not include the spacer thickness 430. The second extension 426 has a width 446 where it crosses the first extension 416. The area of the overlay of the first extension 416 and the second extension 426 establishes the area of the junction stack in the circuit. In some embodiments, the width 446 of the second extension 426 may be the same as the width 445 of the first extension 416 (not including the spacer 415). The positions of two cross sections, "D-D," and "E-E," are marked in the first view 401.

View 402 describes the cross-section D-D, described in the first view 401, of the extension area, showing the disposition of materials and circuit elements in and surrounding the junction stack 435. A first layer of superconductor material 440 rests on a substrate 480. An interface layer 430 rests on top of the first layer of superconductor material 440 and has an upper portion which is an oxidized layer 433. According to some embodiments, the interface layer 430 may have an oxidized layer created by exposing the top of the interface layer to controlled amounts of oxygen, as described previously in FIG. 2. Various embodiments may have only the interface layer 430 without an oxidized layer. The configuration of the interface layer may depend on whether the junction stack 435 is designed to act as a superconductor-insulator-superconductor (S-I-S) Josephson junction or a superconductor-non-superconductor-superconductor S-N-S Josephson junction, as described previously.

A second layer of superconductor material 410 is on top of the oxidized layer 433 of the interface layer 430. A third layer of superconductor material 450 rests on top of the second layer of superconductor material 410 in the area of the junction stack 435. In addition to the portion of the third layer that sits on top of the second layer of superconductor material 410, a portion of the third layer of superconductor material sits on top of and on the outside of a spacer 415 that surrounds the junction stack 435, extends down the side of the spacer 415 and makes contact with the substrate 480. Because the spacer 415, the first layer of superconductor material 440, and a portion of the third layer of superconducting material 450 all rest on the substrate 480, the spacer completely separates and electrically isolates the first layer of superconductor material 440 from the third layer of superconductor material 450. Consistent with the first view 401, the third layer of superconductor material 450 has been patterned like the second superconductor electrode 420, and only a small portion overlies the extension of the first superconductor electrode 405. The spacer 415 extends beyond the limits of the patterned third layer of superconductor material 450, surrounding the first layer of superconductor material 440 on all horizontal sides.

A third view 403 shows the cross section "E-E" of the pad area of the first superconductor electrode 405, according to embodiments. The film stack is substantially similar to that of the second view 402, absent the third layer of superconductor material 450 overlaying the junction stack 435. A first layer of superconductor material 440 lies on a substrate 480, an interface layer 430 with an oxidized layer 433 in a top portion lies on the first layer 440, and a second layer of superconductor material 410 rests on top of the stack. A spacer 415 surrounding the stack can be seen on both sides of the cross-sectional third view 403 with a spacer height 460 that is taller than the interface layer height 465. The spacer height 460 is approximately the same height as the film stack, including the second layer of superconductor material 410. An electrical signal transmitted through a second superconductor electrode 420 would travel through the second layer of superconductor material 410 in the junction stack 435 area.

As the circuit is configured in this intermediate stage of manufacture, an electrical signal transmitted into the second superconductor electrode 420 (such as by a contact that lands on top of the second superconductor electrode) would be transmitted directly into a contact that lands on the first superconductor electrode 405 through the second layer of superconductor material 410 because the second layer runs continuously from the junction stack area into the pad area of the first superconductor electrode 405. Removal of the second layer of superconductor material 410 outside the junction stack 435 can force the current flow through the interface layer 430 into the first layer of superconductor material 440, triggering the Josephson junction to operate as intended.

Figure 5:
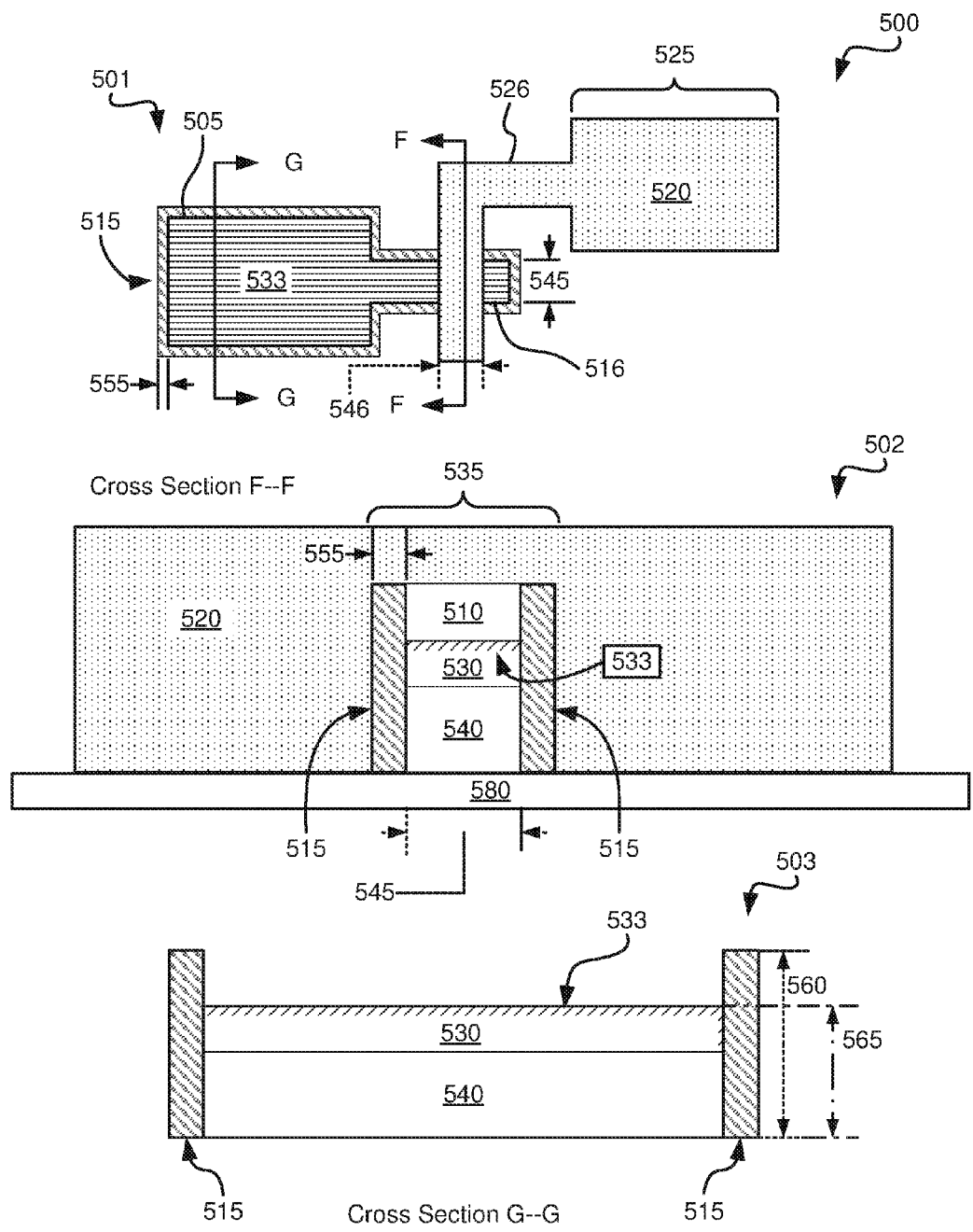
FIG. 5 depicts several views of a Josephson junction after a second electrode is created, according to embodiments.

FIG. 5 depicts several views 500 of an electrical circuit configured to act as a Josephson junction, according to embodiments. The several views 500 detail the layout of conductive and insulating elements that make up the electrical circuit, including a spacer that electrically isolates a first superconductor electrode 505 and a second superconductor electrode 520. The several views include a first view 501 that shows the layout of the circuit elements, with two cross sections marked: cross sections "F-F" and "G-G." The second view 502 is a representation of cross section F-F, and the third view 503 is a representation of cross section G-G.

In the first view 501, a first superconductor electrode 505 is surrounded by a spacer 515 with a spacer thickness 555, the spacer following a perimeter of the first superconductor electrode 505 on all sides of the first electrode. An oxidized layer 533 that makes up a top portion of an interface layer 530 is visible from above the circuit. The first superconductor electrode 505 has a pad area transected by cross section G-G and a first extension 516 transected by cross section F-F. The first extension 516 has a first extension width 545.

A second superconductor electrode 520 has a second pad area 525 and a second extension 526, the second extension crossing over and resting upon the first extension 516. The second extension 526 has a second extension width 546. The junction area of the circuit can be determined by multiplying the first extension width 545 by the second extension width 546, and the variability in the junction area of a plurality of similarly-configured electrical circuits can be estimated according to the dimensional uncertainty in the patterning used to create the first and second extensions.

In the second view 502, the film stack at the cross-section location F-F is portrayed, showing the entire junction stack 535 in the electrical circuit, similar to the junction stack shown in FIG. 4, according to embodiments. A first layer of superconductor material 540 rests on a substrate 580, with an interface layer 530 (having an oxidized layer 533 in a top portion of the interface layer 530) resting on the first layer. A second layer of superconductor material 510 rests on top of the interface layer 530. A spacer 515 that surrounds the first superconductor electrode is visible on two sides of the junction stack 535, with the first extension width 545 shown below the junction stack. The spacer 515, resting on the substrate 580, has a spacer width 555. A third layer of superconductor material in the second superconductor electrode 520 overlays the junction stack 535 and the spacer 515. The second superconductor electrode 520 rests on the substrate 580 and conforms to the top and outside of the spacer 515. The spacer horizontally separates the second extension 526 of the second superconductor electrode 520 from the first superconductor electrode 505. The second layer of superconductor material 510 is electrically connected to the second superconductor electrode 520, but is isolated from the first layer of superconductor material 540 in the first superconductor electrode 505 by the interface layer 530.

The third view 503 shows the cross section of the first superconductor electrode 505 at cross section location G-G, according to embodiments. Unlike the pad area cross section E-E in FIG. 4, the second layer of superconductor material 510 visible in the second view 502 has been etched away in this circuit structure, exposing the top surface of the interface layer 530. In some embodiments the interface layer may be a non-superconducting metal that is directly exposed after removal of the second layer of superconductor material. In other embodiments, such as the one in the third view 503, the top portion of the interface layer 503 may be an oxidized layer 533 created by exposing the interface layer 503 to a controlled amount of oxygen to create an oxide layer with a thickness that conforms to a circuit performance specification.

The spacer height 560 may be taller than the interface layer height 565 (the height of the first layer of superconductor material 540 and the interface layer 530, including any oxidized layer 533 in a top portion of the interface layer), according to embodiments where the second layer of superconductor material has been etched away. The spacer 515, visible on both sides of the third view 503, may surround the first superconductor electrode, but may not serve as an electrically insulating layer in this portion of the first superconductor electrode because there is no conductive material from the second superconductor material 510 against which to insulate the first layer of superconductor material 540.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for making a circuit configured to act as a Josephson junction, the method comprising:
    creating a tri-layer stack on a substrate by:
        depositing a first layer of superconductor material;
        forming an interface layer on the first layer; and
        depositing a second layer of superconductor material on the interface layer;
    shaping a first superconductor electrode from the tri-layer stack by etching the tri-layer stack outside a first pattern to expose the substrate;
    depositing a spacer on a perimeter of the first superconductor electrode;
    depositing a third layer of superconductor material on the substrate, the spacer, and the first superconductor electrode; and
    shaping a second superconductor electrode by:
        creating a second pattern on the third layer of superconductor material that at least partially overlays a first portion of the first superconductor electrode; and
        etching the third layer to expose the substrate and the interface layer such that a second portion of the second superconductor electrode overlays the first portion of the first superconductor electrode and such that the second portion of the second superconductor electrode contacts the substrate on at least one side of the spacer.

2. The method of claim 1, wherein the interface layer is a non-superconductor metal.

3. The method of claim 2, wherein the forming an interface layer further comprises oxidizing a top surface of the non-superconductor metal.

4. The method of claim 1, wherein the depositing a spacer comprises:
    depositing a conformal layer of a spacer material; and
    etching the spacer material to expose the substrate and the second layer.

5. The method of claim 1, wherein the shaping the first superconductor electrode from the tri-layer stack includes creating a first photolithographic pattern on top of the second layer.

6. The method of claim 1, wherein the first pattern is a photolithographic pattern.

7. The method of claim 1, wherein
    the first superconductor electrode has a first pad area and a first extension;
    the second superconductor electrode has a second pad area and a second extension;
    the first portion of the first superconductor electrode is part of the first extension;
    and the second portion of the second superconductor electrode is part of the second extension.

8. The method of claim 1, wherein an extension area of the first superconductor electrode is overlaid by an extension area of the second superconductor electrode.

\* \* \* \* \*